United States Patent [19]

Faes et al.

[11] Patent Number: 4,664,591

[45] Date of Patent: May 12, 1987

[54] APPARATUS FOR PLACING ELECTRONIC AND/OR ELECTRICAL COMPONENTS ON A SUBSTRATE

[75] Inventors: Franciscus C. M. Faes; Johannes T. A. van de Ven; Petrus A. C. Verberne; Jozef G. H. M. Smolders, all of Eindhoven, Netherlands

[73] Assignee: U.S. Philips Corporation, New York, N.Y.

[21] Appl. No.: 799,523

[22] Filed: Nov. 19, 1985

[30] Foreign Application Priority Data

Nov. 19, 1984 [NL] Netherlands ........................ 8403513

[51] Int. Cl.⁴ ............................................. B65G 47/24
[52] U.S. Cl. ...................................... 414/753; 29/834; 414/783
[58] Field of Search ....................... 414/753, 776, 783; 901/16; 29/740, 739, 840, 834

[56] References Cited

U.S. PATENT DOCUMENTS 4,154,350 5/1979 Frohn ............................ 414/753 X
4,475,863 10/1984 Blatt et al. ..................... 414/753 X Primary Examiner—Robert J. Spar
Assistant Examiner—Donald W. Underwood
Attorney, Agent, or Firm—Robert T. Mayer

[57] ABSTRACT

An apparatus for placing electronic and/or electrical components on a substrate, comprising a first carriage which is movable in an X direction and a second carriage which is movable in a Y direction at right angles to the X direction and which carries a number of pick-up devices each capable of picking up a component. A first supporting beam (10) fixedly connected to the Y carriage is provided with a number of rotatable platforms (12) and each of these platforms is coupled via a transmission (36, 38) with a common drive (32) for a rotary movement. Each of the platforms (12) is provided with an operable locking mechanism by which a pick-up device (14) can be locked to each of the platforms (12). The Y carriage further carries a second supporting beam (18) which can move along a guide arranged at right angles to the X—Y plane and has a number of recessed parts (100), each of which is adapted to receive a pick-up device (14), which can be locked therein, in a manner such that each of the pick-up devices (14) can arbitrarily be locked to its associated platform (12) or to the associated recessed part (100).

4 Claims, 8 Drawing Figures

APPARATUS FOR PLACING ELECTRONIC AND/OR ELECTRICAL COMPONENTS ON A SUBSTRATE

The invention relates to an apparatus for placing electronic and/or electrical components on a substrate, which apparatus comprises a first carriage which is movable in an X direction and on which a second carriage is guided for a movement in a Y direction at right angles to the X direction, this second carriage carrying a number of pick-up devices each capable of picking up a component.

An apparatus to which the present invention relates is known from Netherlands patent application No. 8201653 which corresponds to U.S. application Ser. No. 479,585, filed Mar. 28, 1983 and now abandoned and its continuation application Ser. No. 772,196, filed Sept. 3, 1985. This known apparatus is designed to place very small chip like electrical and/or electronic components on a substrate. This machine is provided for this purpose with a large number of vacuum pipettes placed on a transverse beam which is fixedly secured on the Y carriage. These pipettes are first all carried above the supply positions of the components. The pipettes are then all lowered simultaneously and pick up the components, after which the pipettes are brought above the substrate and the components are placed in a given order of succession.

This known apparatus is less suitable for components whose form and size deviate from the so-called chip like components.

The invention has for its object to provide an apparatus by which larger components can be picked up from the supply positions and can then be placed on a substrate.

The apparatus according to the invention is characterized in that a first supporting beam fixedly secured to the Y carriage is provided with a number of rotable platforms, each of which is coupled by a transmission with a common drive for a rotary movement and is provided with an operable locking mechanism by which a pick-up device can be locked to each of the platforms, the Y carriage further comprising a second supporting beam which can be moved along a guide arranged at right angles to the X-Y plane and comprises a number of recessed parts, each of which is adapted to receive a pick-up device which can be locked therein in a manner such that each of the pick-up devices can be arbitrarily locked to its associated platform or to the associated recessed part.

In the apparatus according to the invention, the pick-up devices are preferably constructed as grippers with at least a pair of jaws by which a component can be picked up.

Upon starting, the carriages are first moved so that the platforms connected to the Y carriage are situated above the supply positions of the components. In this situation the second supporting beam is located in its upper position, in which the pick-up devices are in contact with their associated platforms and the pick-up devices are each enclosed by their associated recessed parts of the second supporting beam.

Arbitrarily, one or more pick-up devices are now locked to the said recessed parts. Subsequently, the second supporting beam moves downwards with the locked pick-up devices, which each pick up a component. The second supporting beam then moves upwards again until the pick-up devices are again in contact the platforms. When the pick-up components have to rotated before being placed, locking of the pick-up devices to the platforms now takes place, after which all platforms are simultaneously rotated.

By means of the X and Y carriages, the assembly is then brought above the substrate and the operation of placing the components on the substrate can begin. For this purpose, each of the pick-up devices is brought in order of succession above the position in which it is to be placed. The relevant pick-up device is disengaged from its platform and is locked to the respective recessed part of the second supporting beam. Subsequently, this beam moves downwards and places the component on the substrate, after which the grippers are operated so that the component is released.

In one embodiment of the apparatus according to the invention, the pick-up devices are operated pneumatically, and, in order to avoid the use of supply hoses, each of said recessed parts is provided with a number of ducts which can be connected to a source of compressed air and which open out of the inner side of the recessed part and can cooperate there with ducts in the associated pick-up device.

There is thus obtained a very simple and readily controllable construction for locking each of the pick-up devices the respective recessed part of the second supporting beam and for operating the pick-up device.

In machines of the kind to which the present invention relates, a very high degree of accuracy of the pick-up surfaces of the pick-up device with respect to the overlapping zones of the component is required.

In another embodiment of the apparatus according to the invention, each pick-up device is provided with a central part which carries at least one pair of gripper jaws which are movable towards and away from each other, this central part being enclosed by a housing and being provided with a flange arranged at right angles to the centre line and disposed between an edge of the housing and a pressure member subjected to spring pressure, and ducts being provided in the housing through which air under pressure canbe introduced between the two sides of the flange and the edge of the housing and the pressure member, respectively. With this embodiment it is possible when picking up a component to introduce air between the flange and the edge of the housing and the pressure member, respectively, so that the pair of grippers then floats effectively on an air cushion and can be aligned in the direction of the component to be picked up. Thus, a correct position of the pickup surfaces with respect to the legs of the component is always guaranteed.

It is sometimes desirable to rotate a component into a given angular position before it is placed on the substrate. In order to achieve this by simple means in the apparatus described above, each of the platforms may be provided with a pin which is pivotably connected to a common part which is connected through a driving rod mechanism to the shaft of an electric motor. Thus, all platforms can be rotated simultaneously through a given angle by one motor.

The control of the drives of the three carriages, of the motor for the rotary movement and of the pneumatic operation of the pick-up devices can be effected by means of a suitable program.

The invention will be described more fully with reference to the drawings.

Figure 1:
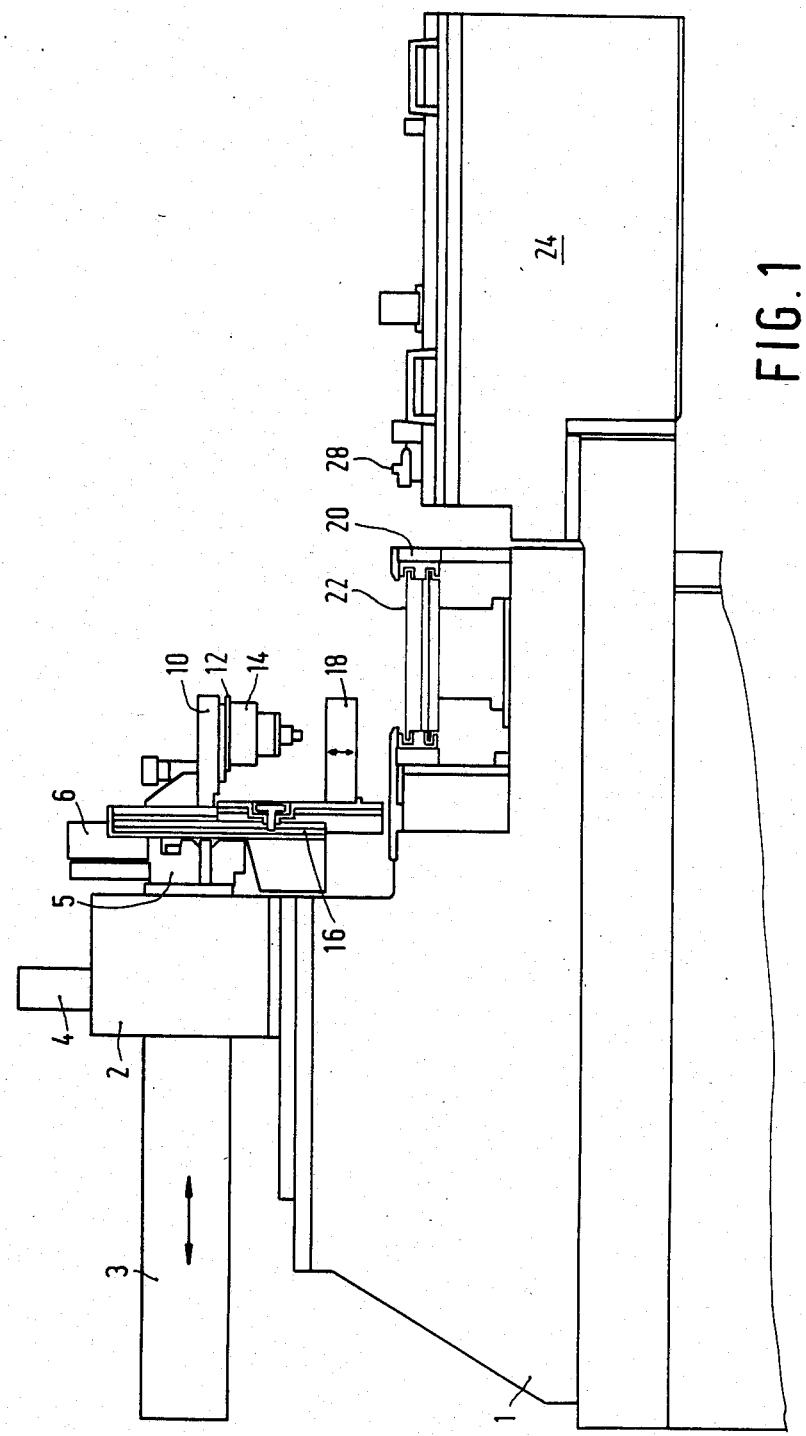
FIG. 1 shows diagrammatically in side elevation an apparatus for placing components on a substrate.
Figure 2:
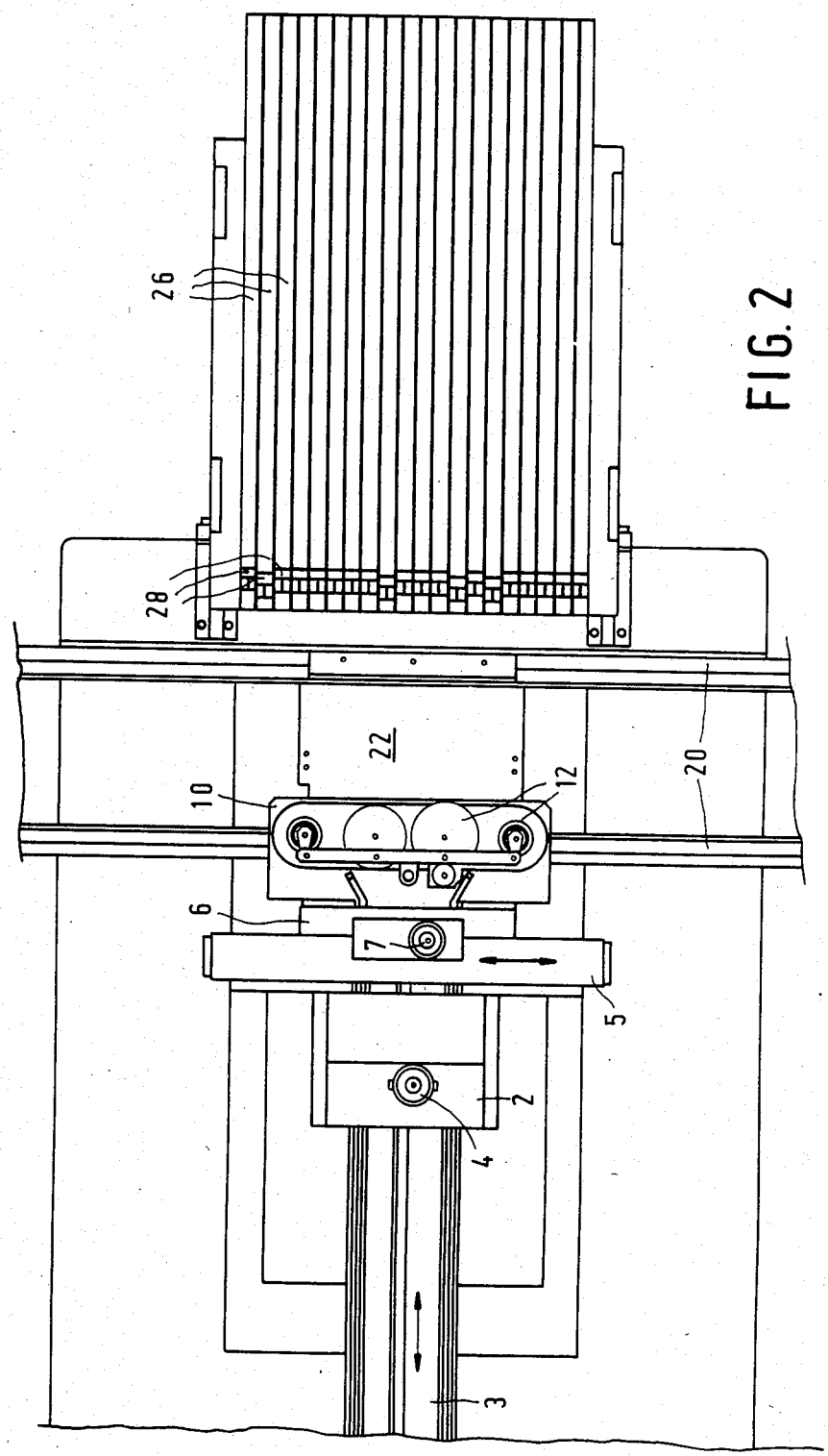
FIG. 2 shows the apparatus of FIG. 1 in plan view.

In FIG. 1, the base part of the apparatus is designated by reference numeral 1. On this base part is arranged a frame 2, in which are located guides and a drive for an X carriage 3. On the frame 2 is mounted a motor 4 which can drive the carriage 3. On the end face of the carriage 3 is mounted a guide beam 5, on which a Y carriage 6 is movably mounted. A motor 7 (FIG. 2) with transmission means can move the Y carriage 6 along the guide beam 5. The Y carriage 6 has fixedly connected to it a first supporting beam 10, which is provided with a number of rotable platforms 12, to each of which a pick-up device 14 can be connected. The Y carriage is further provided with guides 16 along which a second supporting beam 18 can move in the Z direction. Substrates 22 can be supplyed and positioned below the beam 18 by means of the transport device 20.

A device 24 for supplying components is arranged apposite the beams 10 and 18. This device, which is shown only diagrammatically in the drawing, comprises a number of tracks 26 (FIG. 2), along which the various components are supplied to supply positions 28.

Figure 3:
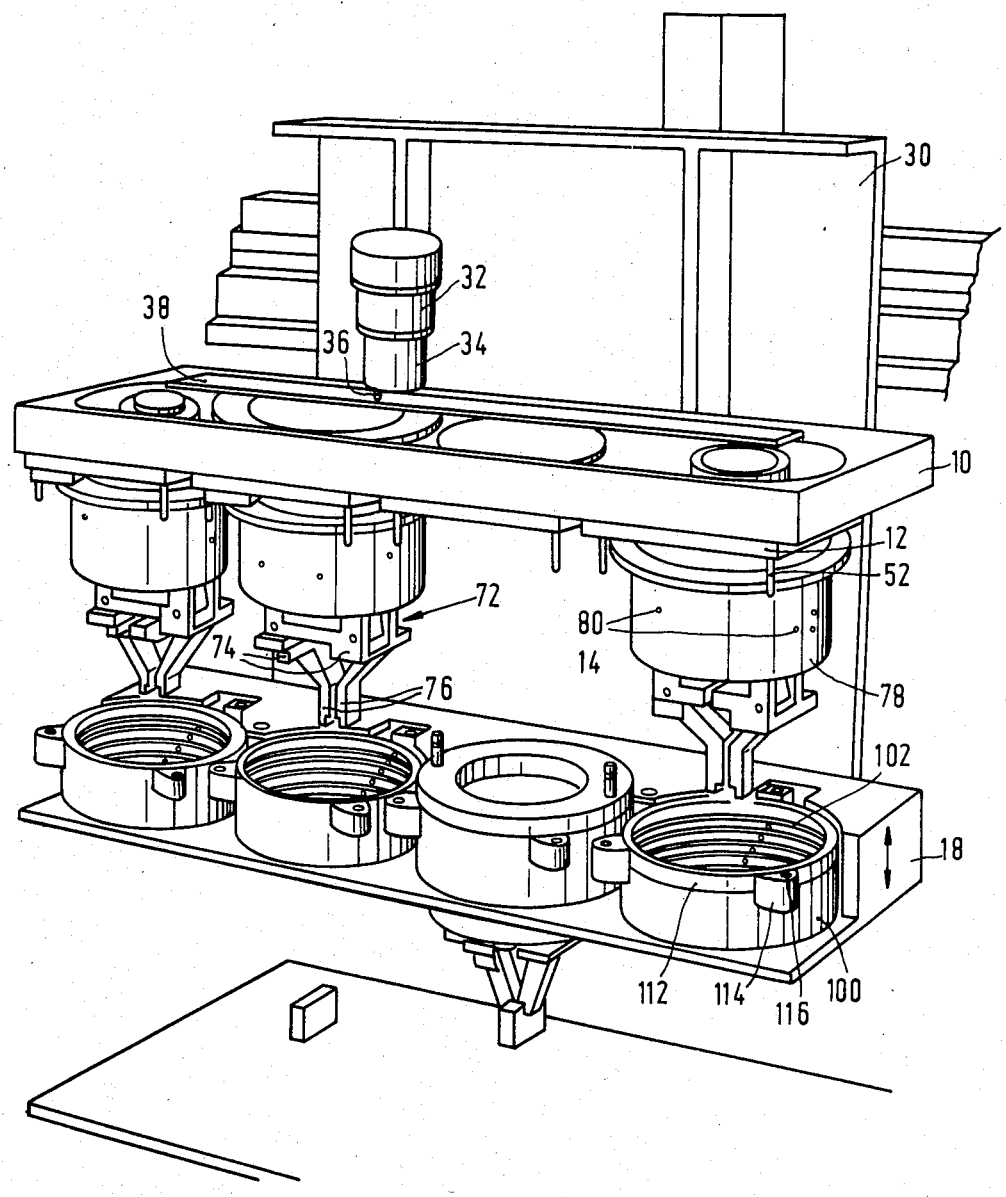
FIG. 3 shows in perspective view on an enlarged scale the part of the apparatus shown in FIGS. 1 and 2 which carries the pick-up devices for the components.
Figure 4:
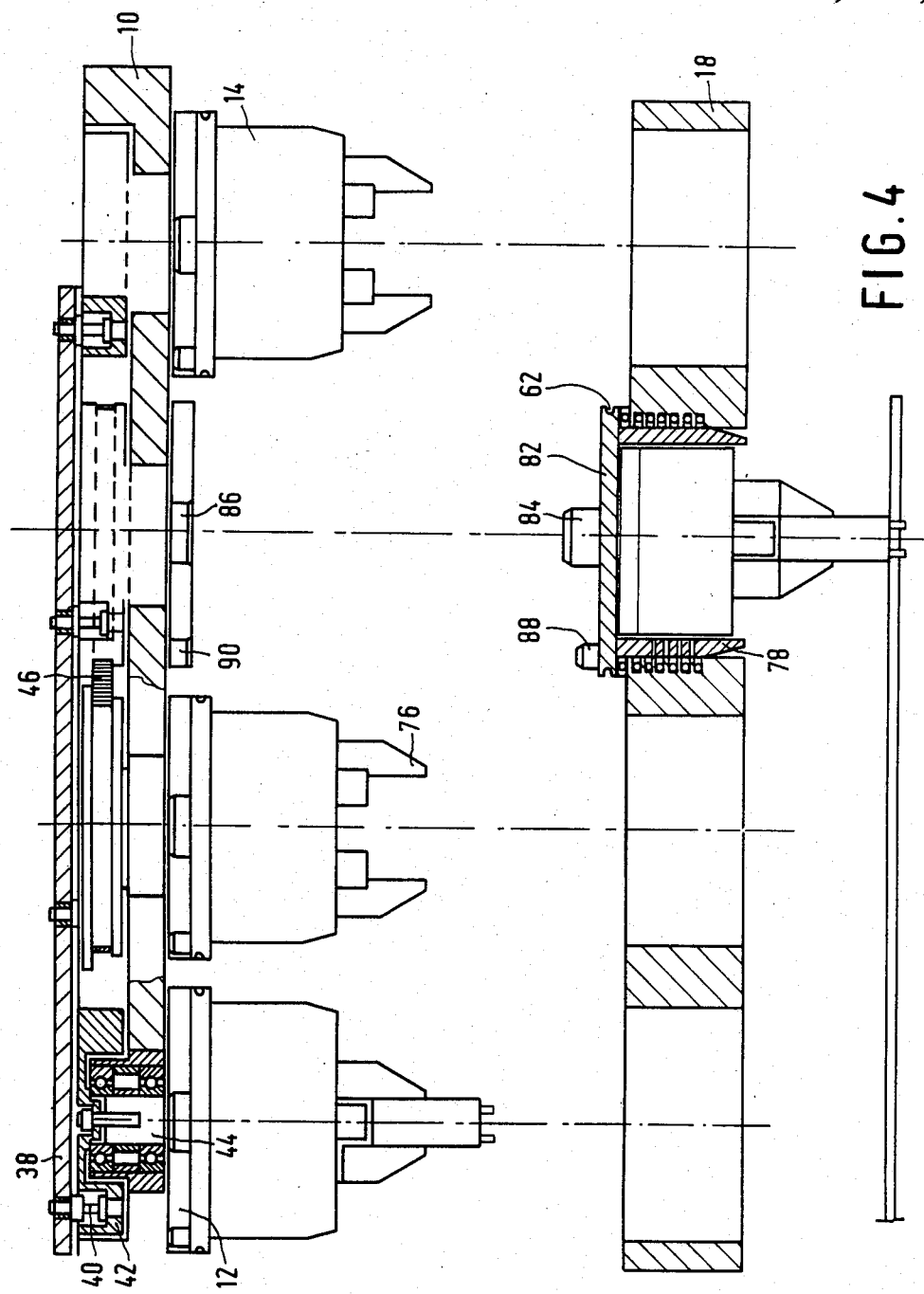
FIG. 4 shows a part of FIG. 3 in a sectional view.

The construction of the beams 10 and 18 with the pick-up devices 14 will be described more fully with reference to FIGS. 3 and 4.

The beam 10 is fixedly connected to a plate 30, which is provided on its rear side with means (not shown) by which it is secured to the Y carriage 6.

On the beam 10 is arranged an electric motor 32, on whose shaft is fixed a collar 34, which is provided with an eccentrically arranged pin 36. The pin 36 is rotatably journalled in a connection yoke 38.

The yoke 38 is rotatably connected by four pins 40 to collars 42, which are each secured on an associated shaft 44. Two of the collars 42 are coupled to each other through a toothed belt 46. The shafts 44 are rotatably journalled in the beam 10 and each carries on its lower end a rotatable platform 12.

Figure 5:
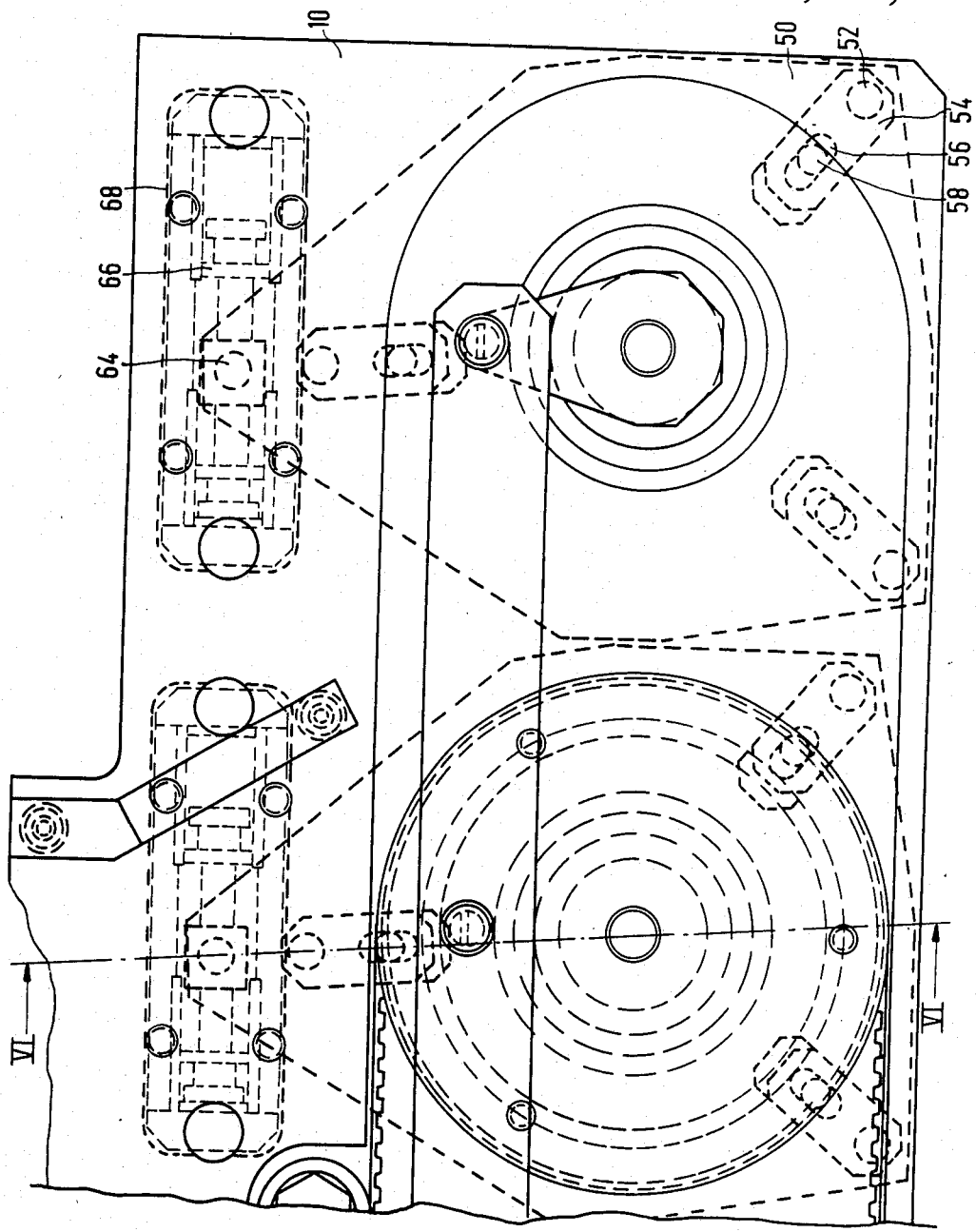
FIG. 5 shows a part of FIG. 3 in plan view.
Figure 6:
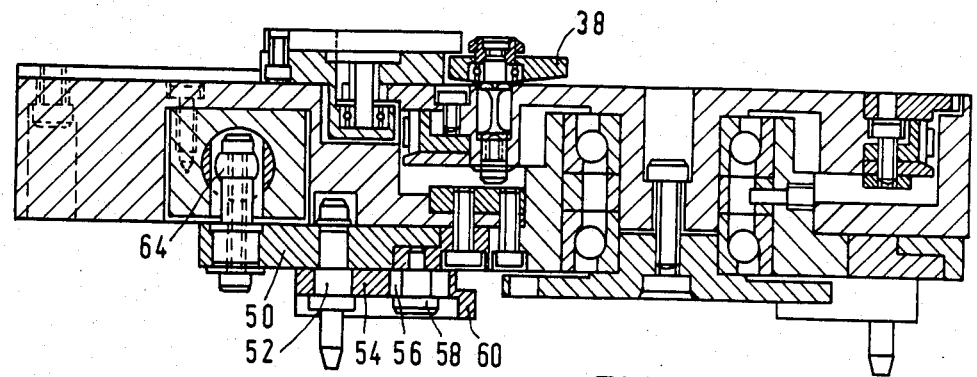
FIG. 6 is a sectional view taken on the line VI—VI in FIG. 5.

A switching plate 50 (FIG. 5) is arranged so as to be rotatable about each of the bearings of the rotatable platforms 12. Each switching plate 50 carries three pins 52, and a clamping member 54 is secured so as to be rotatable about each of these pins. Each clamping member is provided with a slot 56, in which a pin 58 rigidly connected to the beam 10 is slidably arranged. Each clamping member 54 is provided with a nose portion 60 (FIG. 6) having a thickness such that it can engage in a groove 62 in the respective holder 14 (FIG. 4).

Each of the switching plates 50 is further connected through a gudgeon-pin connection 64 (FIGS. 5 and 6) to a piston rod 66 (FIG. 6) of a double-acting pneumatic motor 68.

Each of the holders 14 is adapted to receive a pick-up device, which is composed of a base portion 72 (FIG. 3) having a number of pneumatically operable members, of which only two securing parts 74 are shown, which can be moved pneumatically away from each other and towards each other. To these two parts 74 are connected a pair of gripper jaws 76 which have a form adapted to the component to be picked up.

Figure 7:
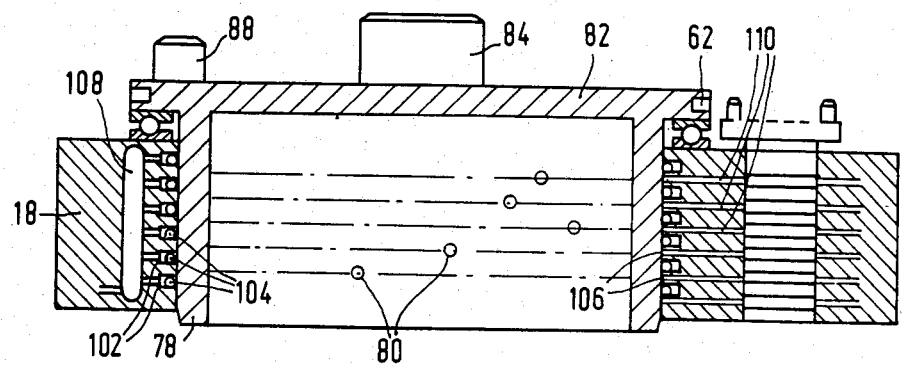
FIG. 7 is a sectional view of a holder for receiving a pick-up device for a component.

As shown in FIG. 7, the holders 14 each have a cylindrical wall 78, which is provided at suitable areas with bores 80, which are arranged so that they communicate on the inner side of the cylinder 78 with ducts in the base portion 72 of the pick-up devices for the supply of compressed air to the various members therein.

The cylinders 78 are each provided at the upper side with a plate 82, which is provided with a central pin 84 adapted to cooperate with a central receiving aperture 86 (FIG. 3) in the respective platform 12 and a catch pin 88 adapted to cooperate with a catch hole 90 in the respective platform 12. The plate 82 is further provided with the aforementioned groove 62.

The beam 18 (FIG. 3) can move in the Z direction along guides and carries a number of cylinders 100, which are each provided on the inner side with a number of grooves 102 accommodating O-rings 104 (FIG. 7) and with a number of further grooves 106. The grooves 102 all communicate with a common duct 108 for the supply of compressed air. The grooves 106 each have an individual duct 110 for the supply of compressed air, all ducts for the supply of compressed air at each holder being connected to a regulating device (not shown), by means of which according to a program compressed air can arbitrarily be supplied to the common duct 108 or to one or more of the ducts 110. A ring 112 (FIG. 3) is arranged to rotate about each of the cylinders 100 and is provided with ears 114 with holes 116 adapted to cooperate with the pins 52.

Figure 8:
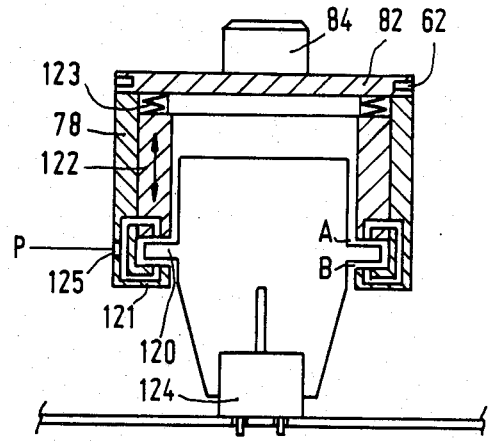
FIG. 8 is a sectional view of a holder in which is arranged a pick-up device, which is not rigidly coupled to the holder during the step of gripping a component.

FIG. 8 shows a holder provided with the said cylindrical wall 78 comprising a pick-up device (shown diagrammatically) which is provided with a flange 120. The flange 120 is arranged between an edge 121 of the holder and a movable pressure member 122, which is urged towards the flange by one or more springs 123.

When a component 124 is picked up, air under pressure can be supplied via an opening 125 on both sides of the flange 120. The pick-up device now effectively floats on an air cushion and the pick-up device can now be fully adapted to the position of the component. When the component has been gripped, the air pressure is interrupted and the pick-up device is fixed in the holder by the pressure member 122. The operation of the arrangement described above is as follows.

By means of the device 24 supplying the components, the desired components are brought into their supply positions 28. By means of the carriages 3 and 5, the assembly of beams 10 and 18 is brought above the supply positions 28. The beam 18 now receives the pick-up devices 14 in the cylinders 100. This is effected by the pneumatic motors 68 rotating the switching plates 50 of all the pick-up devices so that the noses 60 leave the grooves 62. Furthermore, compressed air is supplied to the ducts 108, as a result of which the O rings 104 in the grooves 102 are forced against the cylinders 78. As a result, the pick-up cylinders 78 are fixedly connected to the beam 18. The beam 18 with the pick-up devices 14 fixed therein is now moved to the supply positions 28, after which, by the supply of compressed air to the required ducts 110 and the openings 80, the gripper jaws 76 are opened so that they can pick up a component, whereupon they are closed again.

The beam 18 is then moved upwards again until the pick-up devices 14 again engage the switching plates 12. Subsequently, the assembly of beams 10 and 18 is brought above the substrate 22 and the operation of placing the picked-up components on this substrate can begin.

Depending upon the position in which the various components have to be placed on the substrate, one or more components can now be placed simultaneously. For this purpose, the desired pick-up devices 14 are clamped in their cylinders 100 by means of compressed air in the duct 108 and the grooves 102. At the same time, the lock between the relevant pick-up devices 14 and their associated platforms 12 is released. This is effected by the relevant pneumatic motors 68 being operated so that the associated switching plates 50 are rotated in the direction in which the noses 60 leave the grooves 62.

The pick-up devices 14 are now fixedly connected to the beam 18 and can be moved therewith towards the substrate, while a program ensures that the relevant components are brought above their correct positions by the X and Y carriages 3 and 5, respectively.

The operation of placing is again controlled pneumatically, while compressed air is supplied by a regulating valve to the ducts 110 in the correct order of succession, by means of which through openings 80 the various members of the gripper jaws 76 are operated.

If certain components have to be rotated before they are placed, this is effected in that by means of the motor 32 and the crank driving rod mechanism or transmission 36, 38 each of the rotatable platforms 12 and the pick-up devices 14 connected thereto are rotated.

Thus, an apparatus is obtained by means of which components of different dimensions and shape can be placed on substrates at a high speed and with a great accuracy.

What is claimed is:

1. An apparatus for placing electronic and/or electrical components on a substrate comprising a first carriage movable in an X direction, a second carriage guided on said first carriage and movable in a Y direction at right angles to the X direction, the X and Y directions defining an X-Y plane, a number of pick-up devices carried on said second carriage, each pick-up device being capable of picking up a component, a first supporting beam fixedly connected to said second carriage, said supporting beam having a number of rotatable platforms, a transmission common to said number of rotatable platforms for providing rotary movement thereto, each rotatable platform being provided with an operable locking mechanism by which an associated pick-up device can be locked to an associated one of said platforms, a second supporting beam on said second carriage, said second supporting beam being movable at right angles to the X-Y plane and having a number of recessed parts, each of said recessed parts being adaptable to receive a pick-up device, and locking means whereby an associated pick-up device can be locked to an associated recessed part whereby said pickup devices can be moved to the first supporting beam by the second supporting beam so as to be positionable by the first supporting beam and then reconnected to the second supporting beam.

2. An apparatus as claimed in claim 1, wherein at least some of said pick-up devices have ducts in them and wherein at least some of said recessed parts are provided with a number of ducts which can be connected to a source of compressed air and which open out of the inner side of their associated recessed part and can cooperate there with ducts in an associated one of said at least some of said pick-up devices.

3. An apparatus as claimed in claim 2, wherein each of the pick-up devices is provided with a central part having at least one pair of gripper jaws which can be moved towards and away from each other, said central part being enclosed in a housing and being provided with a two-sided flange arranged at right angles to said housing and with a pressure member subjected to spring force, said flange being disposed between an edge of said housing and said pressure member, said housing being provided with ducts through which air under pressure can be introduced between the two sides of the flange and the edge of the housing and the pressure member.

4. An apparatus as claimed in claim 1, wherein said transmission includes an electric motor, a pin and a part common to all said platforms, said pin being connected to said motor and arranged to pivotably move said common part.

* * * * *